(12) United States Patent
Jin et al.

(10) Patent No.: US 11,978,490 B2
(45) Date of Patent: May 7, 2024

(54) BACK PATTERN COUNTER MEASURE FOR SOLID STATE DRIVES

(71) Applicant: Western Digital Technologies, Inc., San Jose, CA (US)

(72) Inventors: Ming Jin, Fremont, CA (US); Yongke Sun, Pleasanton, CA (US); Lanlan Gu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 112 days.

(21) Appl. No.: 17/752,112

(22) Filed: May 24, 2022

(65) Prior Publication Data

US 2023/0410866 A1 Dec. 21, 2023

(51) Int. Cl.
*G11C 11/16* (2006.01)
*G11C 11/408* (2006.01)

(52) U.S. Cl.
CPC ...... *G11C 11/1657* (2013.01); *G11C 11/1673* (2013.01); *G11C 11/4087* (2013.01)

(58) Field of Classification Search
CPC ............ G11C 11/1657; G11C 11/1673; G11C 11/4087
USPC .................................................. 365/167, 168
See application file for complete search history.

(56) References Cited

U.S. PATENT DOCUMENTS

| | | | | |
|---|---|---|---|---|
| 10,726,896 | B1 * | 7/2020 | Jacob | G11C 11/1673 |
| 2016/0141046 | A1 * | 5/2016 | Khandelwal | G11C 11/5628 |
| | | | | 365/185.02 |
| 2016/0141047 | A1 * | 5/2016 | Sehgal | G11C 16/349 |
| | | | | 365/185.02 |
| 2016/0240262 | A1 * | 8/2016 | Shah | G11C 16/34 |
| 2016/0306591 | A1 * | 10/2016 | Ellis | G06F 3/061 |
| 2019/0362796 | A1 * | 11/2019 | Choi | G11C 16/14 |
| 2020/0075114 | A1 * | 3/2020 | Lin | G06F 11/1048 |
| 2020/0143885 | A1 * | 5/2020 | Kim | G11C 16/3427 |
| 2021/0057021 | A1 * | 2/2021 | Wu | G11C 11/4085 |
| 2021/0134352 | A1 * | 5/2021 | Lin | G11C 11/4063 |
| 2022/0076731 | A1 * | 3/2022 | Rooney | G11C 11/4091 |
| 2022/0148642 | A1 * | 5/2022 | Lovett | G11C 8/08 |
| 2022/0155999 | A1 * | 5/2022 | Sikarwar | G06F 3/0659 |
| 2022/0165347 | A1 * | 5/2022 | Pan | G11C 7/065 |
| 2022/0254404 | A1 * | 8/2022 | Wan | G11C 5/063 |
| 2023/0005532 | A1 * | 1/2023 | Mirichigni | G11C 13/0028 |
| 2023/0186970 | A1 * | 6/2023 | Shang | G11C 11/4085 |
| | | | | 365/230.06 |

FOREIGN PATENT DOCUMENTS

WO  WO-2014092966 A1 *  6/2014  ......... G06F 12/0246

* cited by examiner

*Primary Examiner* — Michael T Tran
(74) *Attorney, Agent, or Firm* — Michael Best & Friedrich LLP

(57) ABSTRACT

This disclosure includes back pattern counter measures for solid state drives. Embodiments described herein include setting and applying read threshold offsets according to flags set based on an amount of data stored within a memory block (e.g., an "openness" of the block). The flag is implemented during read commands to account for shifts in voltage distribution of open blocks. A value of the flag may be chosen based on a number of word lines included in the block that store data. The read threshold offsets may further be based on at least one of the set flag or an age of a respective NAND cell.

17 Claims, 7 Drawing Sheets

| BP_Flag | 1 | 2 | 3 | 0 |
|---|---|---|---|---|
| Last WL | WL1 | WL2 | WL3 | >WL3 |

BACK PATTERN COUNTER MEASURE FOR SOLID STATE DRIVES

BACKGROUND

This application relates generally to data storage devices and, more particularly, to implementing countermeasures with flags representing the openness of a memory block to improve read functions in data storage device.

Memory devices store data within blocks. A block is a closed block when the block is fully programmed, and an open block when the block is partially programmed. Blocks include a plurality of word lines, each word line storing a plurality of bits of data. The voltage distribution between word lines in open blocks are shifted compared to word lines in closed blocks. This shift in the voltage distribution is henceforth referred to as the back pattern (BP) effect.

SUMMARY

High fail bit counts and high retry events may occur when reading from word lines in an open bock and using the normal read levels. The techniques of the present disclosure characterize, implement, and apply optimized read levels when reading from an open block, reducing or eliminating high fail bit count and high retry events. Reduction of fail bit count and retry events improves the drive performance of a solid state drive (SSD).

To characterize optimized read levels for open blocks, a two-dimensional BP offset table is created based on characterization results from open blocks with different levels of openness. A flag is used in the Flash Translation Layer (FTL) level to represent the openness of an open block. This flag is provided to the flash module when reading an open block.

The disclosure provides a data storage device including, in one embodiment, a memory interface configured to interface with a non-volatile memory, and an electronic processor. The electronic processor is configured to receive a read command to read data stored in a block of the non-volatile memory, determine a last coded word line of the block, and set a flag indicative of the last coded word line that is determined.

The disclosure also provides a method. In one embodiment, the method includes receiving a read command to read data stored in a block of a non-volatile memory, determining a last coded word line of the block, and setting a flag indicative of the last coded word line that is determined.

The disclosure also provides a memory device that supports setting a flash module flag. The memory device includes a memory including at least one block for storing data, the block composed of a plurality of word lines, and a controller configured to set a flag value based on a last word line storing data within the block.

In this manner, various aspects of the disclosure provide for improvements in at least the technical fields of data storage devices and their design and architecture. The disclosure can be embodied in various forms, including hardware or circuits controlled by firmware (i.e., code executing on a processor), and computer systems and networks; as well as hardware-implemented methods, signal processing circuits, memory arrays, application specific integrated circuits, field programmable gate arrays, and the like. The foregoing summary is intended solely to give a general idea of various aspects of the disclosure, and does not limit the scope of the disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the memory device may be performed by hardware (e.g., analog or digital circuits), a combination of hardware and software (e.g., program code or firmware, stored in a non-transitory computer-readable medium, that is executed by processing or control circuitry), or any other suitable means. The following description is intended solely to give a general idea of various aspects of the disclosure, and does not limit the scope of the disclosure in any way.

Figure 1:
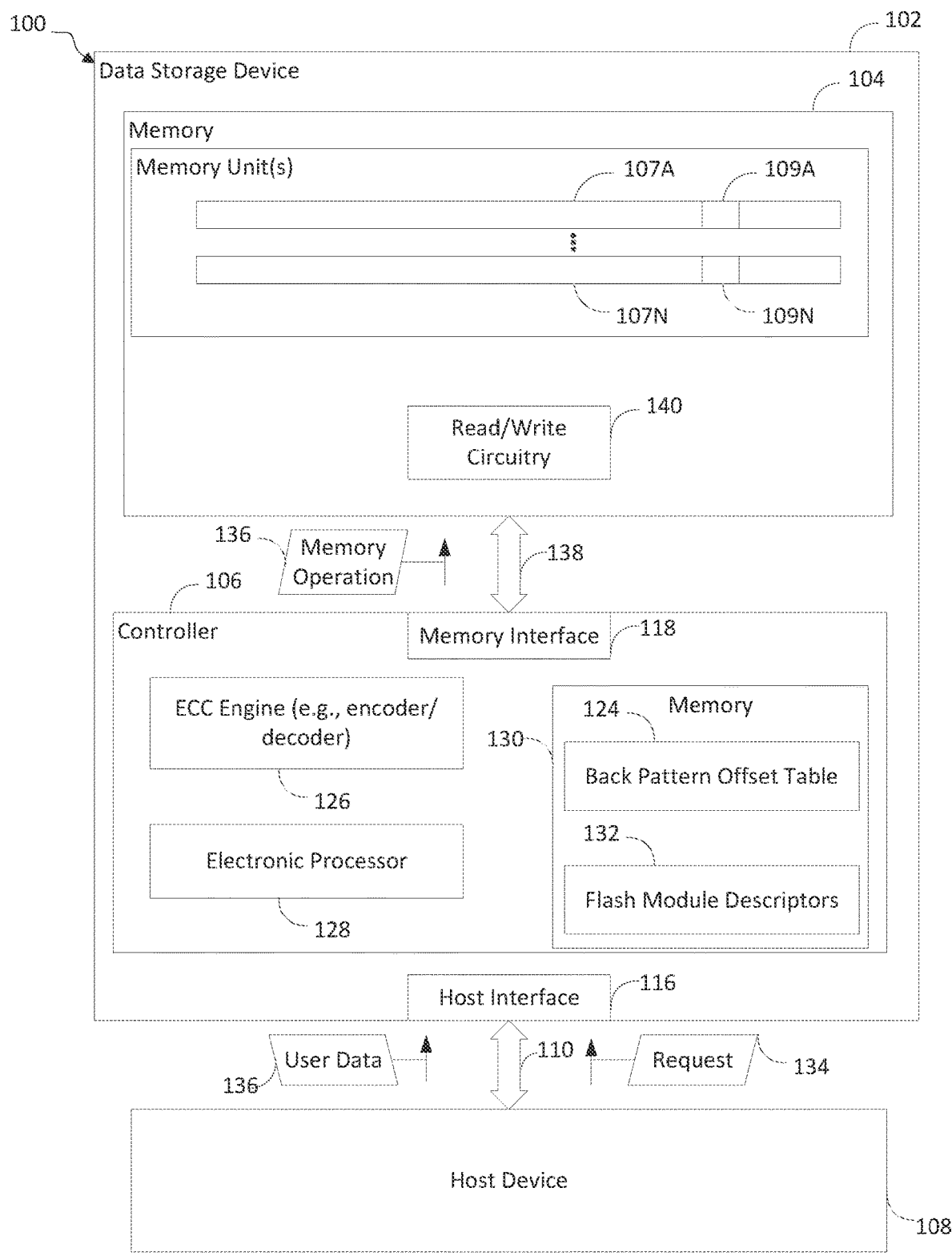
FIG. 1 is block diagram of a system including a data storage device with back pattern counter measures, in accordance with some embodiments of the disclosure.

FIG. 1 is a block diagram of one example of a system 100 that includes a data storage device 102. In some implementations, the data storage device 102 is a flash memory device. For example, the data storage device 102 is a Secure Digital SD® card, a microSD® card, or another similar type of data storage device. The data storage device 102 illustrated in FIG. 1 includes a memory 104 (e.g., a non-volatile memory) and a controller 106 (referred to hereinafter as "data storage device controller") coupled to the memory 104.

The data storage device 102 is coupled to a host device 108. The host device 108 is configured to provide data 110 (for example, user data 136) to the data storage device 102 to be stored, for example, in the memory 104. The host device 108 is, for example, a smart phone, a music player, a video player, a gaming console, an e-book reader, a personal digital assistance device, a tablet, a notebook computer, or another similar device.

In some implementations, the non-volatile memory 104 is NAND flash memory. The non-volatile memory 104 illustrated in FIG. 1 includes a plurality of memory units 107A-107N (for example, flash memory units). Each of the plurality of memory units 107A-107N includes a plurality of storage elements. For example, in FIG. 1, the memory unit 107A includes a representative storage element 109A. In some implementations, the storage element 109 is a multi-level cell flash memory, such as a 2 levels cell ("SLC"), a 4 levels cell ("MLC"), an 8 levels cell ("TLC"), a 16 levels cell ("QLC"), or a flash memory cell having a larger number of bits per cell (for example, greater than four bits per cell). In some implementations, the plurality of memory units 107A-107N are blocks configured to store data. The storage elements 109A-109N represent word lines within the blocks.

The data storage device controller 106 illustrated in FIG. 1 includes a host interface 116, a memory interface 118, an error code correction (ECC) engine 120, and an electronic processor 128. The data storage device controller 106 is illustrated in FIG. 1 in a simplified form. One skilled in the art would recognize that a controller for a non-volatile memory would include additional modules or components other than those specifically illustrated in FIG. 1. Additionally, although the data storage device 102 is illustrated in FIG. 1 as including the data storage device controller 106 and modules for performing, for example, flag setting, in other implementations, the data storage device controller 106 is instead located within the host device 108 or is otherwise separate from the data storage device 102. As a result, flag setting and other flash translation layer ("FTL") operations and flash module ("FM") operations that would normally be performed by the data storage device controller 106 (for example, wear leveling, bad block management, data scrambling, garbage collection, address mapping, etc.) can be performed by the host device 108 or another device that connects to the data storage device 102.

The data storage device controller 106 is configured to send data to, and receive data and instructions from, the host device 108 via the host interface 116. The host interface 116 enables the host device 108 to, for example, read from the non-volatile memory 104 by transmitting requests 134 and to write to the non-volatile memory 104 by sending user data 136 and using any suitable communication protocol. Suitable communication protocols include, for example, the Universal Flash Storage ("UFS") Host Controller Interface specification, the Secure Digital ("SD") Host Controller specification, etc.

The data storage device controller 106 is also configured to send data and commands to (e.g., the user data 136, the requests 134), and receive data from, the memory 104 with the memory interface 118. As an illustrative example, the data storage device controller 106 is configured to send data and a write command to instruct the memory 104 to store data in a particular memory location in the memory 104. The data storage device controller 106 is also configured to send a read command to the memory 104 to read data from a particular memory location in the non-volatile memory 104. In some examples, the controller 106 is coupled to the non-volatile memory 104 with a bus 138 in combination with the memory interface 118.

The data storage device controller 106 illustrated in FIG. 1 includes an electronic processor 128 (for example, a microprocessor, a microcontroller, a field-programmable gate array ["FPGA"] semiconductor, an application specific integrated circuit ["ASIC"], or another suitable programmable device) and a non-transitory computer readable medium or memory 130 (for example, including random access memory ["RAM"] and read only memory ["ROM"]). The electronic processor 128 is operatively connected to the various modules within the data storage device controller 106 and the data storage device 102. For example, firmware is loaded in a ROM of the memory 130 as computer executable instructions. Those computer executable instructions are capable of being retrieved from the memory 130 and executed by the electronic processor 128 to control the operation of the data storage device 102 and perform the processes described herein (for example, flag setting and read operations). In some implementations, one or more modules of the data storage device controller 106 correspond to separate hardware components within the data storage device controller 106. In other implementations, one or more modules of the data storage device controller 106 correspond to software stored within the memory 130 and executed by the electronic processor 128. The memory 130 is configured to store data used by the electronic processor 128 during operation. For example, the memory 130 stores a BP offset table 124 and a plurality of flash module descriptors 132, as described below in more detail.

Figure 2:
FIG. 2 is a table of back pattern flag values and their associated word line thresholds, in accordance with some embodiments of the disclosure.

Performing read operations of open blocks often results in high fail bit count events and high retry events, as the voltage distribution of open blocks shifts compared to closed blocks. To assist with read operations of open blocks, a flag may be implemented indicating "fullness" or "openness" of a block. FIG. 2 provides an example table 200 for assigning a flag value (henceforth referred to as a "BP flag"). As word lines within a block are written to sequentially (e.g., from left to right, in numerical order, or other suitable order), the BP flag is set according to how many word lines store data. In the example of FIG. 2, when the last word line storing data (e.g., the last coded word line, last programmed word line) is less than or equal to a first word line threshold WL1, the BP flag is set to 1. When the last word line storing data is less than or equal to a second word line threshold WL2, the BP flag is set to 2. When the last word line storing data is less than or equal to a third word line threshold WL3, the BP flag is set to 3. When the last word line storing data is greater than the third word line WL3, the BP flag is set to 0. The first word line threshold WL1 may be, for example 11. The second word line threshold WL2 may be, for example, 21. The third word line threshold WL3 may be, for example, 41.

The values of the BP flag in the table 200 are merely examples, and may be set to different values based on the last word line storing data. While the values of the BP flag in the table 200 can be expressed as two-bit values, the BP flag may also be other values, such as a single bit value (having a single corresponding word line threshold) or a four bit value (having sixteen corresponding word line thresholds). Additionally, the word line thresholds may vary. In some examples, each block is comprised of 96 word lines. Accordingly, the word line thresholds may be set to split the block into four sections, where WL1 is set to 24, WL2 is set to 48, and WL3 is set to 72.

Figure 3:
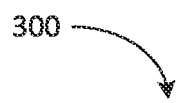
FIG. 3 is an example flash module descriptor for a read command, in accordance with some embodiments of the disclosure.

To assist with read commands, the BP flag is implemented with flash module descriptors used for read commands. FIG. 3 provides an example flash module descriptor 300 for a read command (READ CMD) in accordance with various aspects of the present disclosure. The flash module descriptor 300 is, for example, one of the plurality of flash module descriptors 132 stored in the memory 130. The flash module descriptor 300 includes a plurality of instructions (provided as binary values) to assist the electronic processor 128 in performing the respective read function. The row of the flash module descriptor 300 provides for a byte of data within the flash module descriptor 300. Each column corresponds to one of the eight bits within the byte. The BP flag within the flash module descriptor 300 is set at byte 12, bits 2 and 3.

Figure 4:
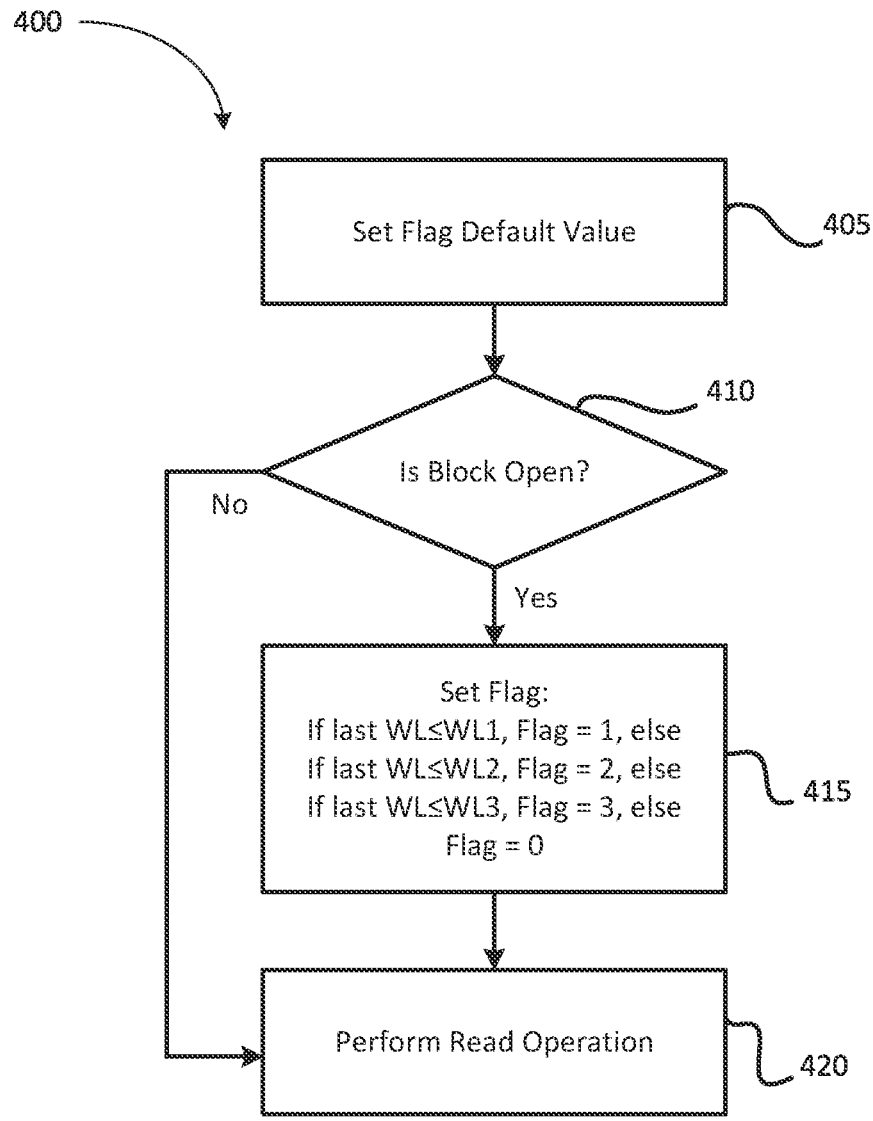
FIG. 4 is a flow diagram illustrating an example method for assigning a back pattern flag value, in accordance with some embodiments of the disclosure.

FIG. 4 is a flow diagram illustrating an example process 400 for setting the BP flag, in accordance with various aspects of the present disclosure. The process 400 is described with respect to the data storage device controller 106 of FIG. 1. In some instances, the data storage device controller 106 performs the process 400 in response to receiving a read command. While FIG. 4 illustrates a particular order of steps, in some embodiments, steps may be performed in a different order. Additionally, in some embodiments, the process 400 includes additional steps or fewer steps.

As illustrated in FIG. 4, the process 400 includes the data storage device controller 106 setting the BP flag at a default value (at block 405). The default value may be, for example, 0. The default value may be set prior to receiving a read command, or may be set in response to receiving the read command.

The process 400 includes the data storage device controller 106 determining whether the block is an open block (at decision block 410). When the block is not an open block (i.e., the block is fully programmed, "NO" at decision block 410), the data storage device controller 106 performs the read operation (at block 420). When the block is an open block (i.e., is not fully coded, "YES" at decision block 410), the data storage device controller 106 sets the BP flag (at block 415). For example, and with reference to FIG. 2, the data storage device controller 106 compares the last word line storing data to at least one word line threshold. When the last word line storing data is less than or equal to a first word line threshold WL1, the data storage device controller 106 sets the BP flag to 1. When the last word line storing data is less than or equal to a second word line threshold WL2, the data storage device controller 106 sets the BP flag to 2. When the last word line storing data is less than or equal to a third word line threshold WL3, the data storage device controller 106 sets the BP flag to 3. When the last word line storing data is greater than the third word line WL3, the data storage device controller 106 sets the BP flag to 0. Once the BP flag is set, the process 400 includes the data storage device controller 106 performing the read operation (at block 420).

Figure 5:
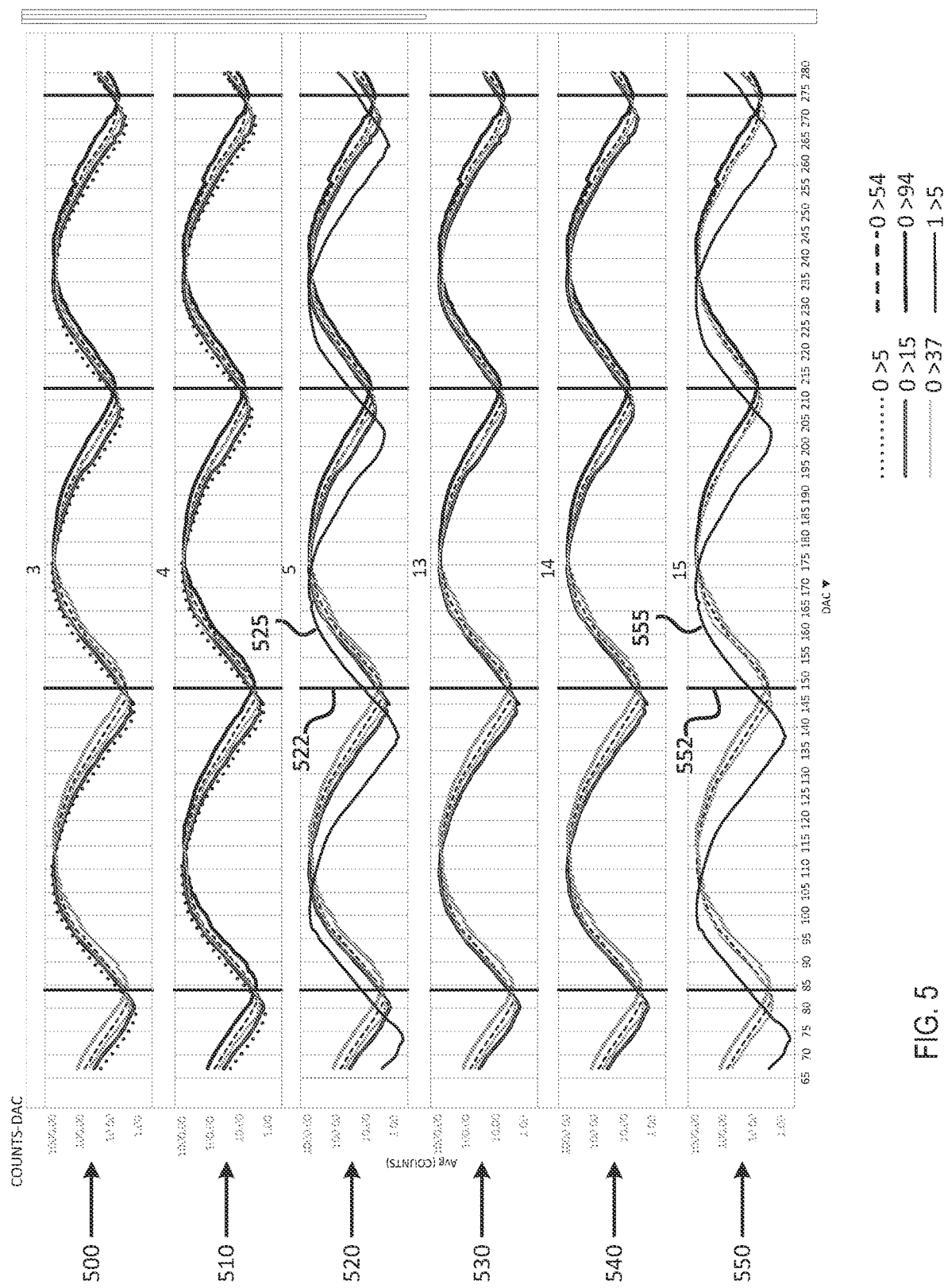
FIG. 5 is a diagram illustrating example read threshold shifts of open blocks, in accordance with some embodiments of the disclosure.

The voltage distribution of the word line in an open block varies greatly with different block openness, and accordingly may be handled differently. For example, FIG. 5 is a diagram illustrating several graphs illustrating example read threshold (e.g., voltage threshold) shifts based on the "fullness" of a block. In the example of FIG. 5, a block has a total of 94 word lines. First graph 500 illustrates the voltage distribution of word line 3. Second graph 510 illustrates the voltage distribution of word line 4. Third graph 520 illustrates the voltage distribution of word line 5. Fourth graph 530 illustrates the voltage distribution of word line 13. Fifth graph 540 illustrates the voltage distribution of word line 14. Sixth graph 550 illustrates the voltage distribution of word line 15. Each separate function within the graphs illustrates a different "fullness" of the block.

With reference to the first graph 500, the second graph 510, and the third graph 520, the block may be programmed through the word line 5. In this scenario, the voltage distribution 525 of third graph 520 (e.g., word line 5) is shifted to the left compared to the first graph 500 and the second graph 510, and a minimum of the voltage distribution 525 no longer substantially aligns with the voltage threshold 522.

Sixth graph 550 experiences a similar phenomenon when the block is programmed through the word line 15. In this scenario, the voltage distribution 555 of sixth graph 550 (e.g., word line 15) is shifted to the left compared to the fourth graph 530 and the fifth graph 540, and a minimum of the voltage distribution 555 no longer substantially aligns with the voltage threshold 552.

Figure 6:
FIG. 6 is a table illustrating an example read threshold offset table, in accordance with some embodiments of the disclosure.

In some instances, the BP flag is used to establish a read threshold offset table for the shifted voltage distributions of the word lines. FIG. 6 is a table illustrating an example read threshold offset table 600 for a block, in accordance with various aspects of the present disclosure. Since the BP offset is 0 when the BP flag is 0, to minimize DRAM storage sizes, the corresponding BP offset entries where the BP flag is 0 are omitted in FIG. 6. The read threshold offset table 600 may be, for example, the BP offset table 124 stored in the memory 130. Values in the read threshold offset table 600 are indexed based on the set BP flag value for a block and a remaining life value of the block. The remaining life value of the block corresponds with the remaining life of the corresponding NAND cell. A new NAND cell has a remaining life of 100. A NAND cell at the end of its life has a remaining life of 0. Additionally, the read threshold offset table 600 provides for seven read levels in the case of three-bit-per-cell, for example, for each BP flag value: A, B, C, D, E, F, and G. The data storage device controller 106 refers to the read threshold offset table 600 to set an offset value for a given block.

Figure 7:
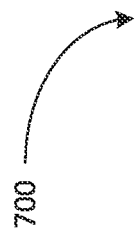
FIG. 7 is a table illustrating another example read threshold offset table, in accordance with some embodiments of the disclosure.

FIG. 7 provides an example read level of the read threshold offset table 600 at an example remaining life value. For example, the read threshold offset table 700 provides a specific read threshold offset value for the "fullness" of the respective block. The block of FIG. 7 includes 94 word lines. In the example of FIG. 7, for a block programmed up to word line 5, the read threshold offset value is −8. When the block is programmed up to word line 15, the read threshold offset value is −7. When the block is programmed up to word line 37, the read threshold offset value is −4. When the block is programmed up to word line 54, the read threshold offset value is −2. When the block is either fully programmed or the last word line storing data reaches the predetermined word line threshold (in the example of FIG. 7, word line 54), the BP flag is set to 0 and, correspondingly, the read threshold offset value is 0. Accordingly, the more word lines that are programmed, the less of a shift the voltage distribution experiences. With reference to FIG. 4, the read threshold offset tables 600, 700 may individually or collectively be used by the data storage device controller 106 when performing the read operation (at block 420).

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device, comprising:
a memory interface configured to interface with a non-volatile memory; and
an electronic processor configured to:
receive a read command to read data stored in a block of the non-volatile memory,
determine a last coded word line of the block,
set a flag indicative of the last coded word line that is determined,
determine a read threshold offset value based on the last coded word line of the block, and
perform a read command using the read threshold offset value that is determined.

2. The data storage device of claim 1, wherein the electronic processor is further configured to:
set the flag indicative of the last coded word line within a flash module descriptor.

3. The data storage device of claim 1, wherein the electronic processor is further configured to:
determine whether the block is an open block, and
perform, in response to determining that the block not the open block, the read command.

4. The data storage device of claim 3, wherein the electronic processor is further configured to:
determine, in response to determining that the block is the open block, whether the data to be read is within the last coded word line of the block,
determine, in response to determining that the data to be read is not within the last coded word line of the block, the last coded word line of the block, and
set the flag indicative of the last coded word line of the block.

5. A data storage device, comprising:
a memory interface configured to interface with a non-volatile memory; and
an electronic processor configured to:
receive a read command to read data stored in a block of the non-volatile memory,
determine a last coded word line of the block,
set a flag indicative of the last coded word line that is determined,
determine whether the last coded word line is less than or equal to a word line threshold by comparing the last coded word line to the word line threshold,
set, in response to determining that the last coded word line is less than or equal to the word line threshold, the flag indicative of the last coded word line to a first value, and
set, in response to determining that the last coded word line is greater than the word line threshold, the flag indicative of the last coded word line to a second value.

6. The data storage device of claim 1, wherein the flag is a two-bit flag.

7. The data storage device of claim 1, wherein the read threshold offset value is determined based on the set flag and an age of a respective NAND cell.

8. A method comprising:
receiving a read command to read data stored in a block of a non-volatile memory,
determining a last coded word line of the block,
setting a flag indicative of the last coded word line that is determined,
determining a read threshold offset value based on the last coded word line of the block, and
performing the read command using the read threshold offset value that is determined.

9. The method of claim 8, further comprising:
setting the flag indicative of the last coded word line within a flash module descriptor.

10. The method of claim 8, further comprising:
determining whether the block is an open block, and
performing, in response to determining that the block is not the open block, the read command.

11. The method of claim 10, further comprising:
determining, in response to determining that the block is the open block, whether the data to be read is within the last coded word line of the block,
determining, in response to determining that the data to be read is not within the last coded word line of the block, the last coded word line of the block, and
setting the flag indicative of the last coded word line of the block.

12. The method of claim 10, further comprising:
determining whether the last coded word line is less than or equal to a word line threshold by comparing the last coded word line to the word line threshold,
setting, in response to determining that the last coded word line is less than or equal to the word line threshold, the flag indicative of the last coded word line to a first value, and
setting, in response to determining that the last coded word line is greater than the word line threshold, the flag indicative of the last coded word line to a second value.

13. A memory device that supports setting a flash module flag, the memory device comprising:
a memory including at least one block for storing data, the block composed of a plurality of word lines; and
a controller configured to set a flag value based on a last coded word line storing data within the block,
wherein the controller is further configured to set a read threshold offset value based on the last coded word line of the block.

14. The memory device of claim 13, wherein the controller is further configured to set the flag value indicative of the last coded word line within a flash module descriptor.

15. The memory device of claim 13, wherein the controller is further configured to set the flag value when the block is an open block.

16. The memory device of claim 13, wherein the flag value is a two-bit flag.

17. A memory device that supports setting a flash module flag, the memory device comprising:
- a memory including at least one block for storing data, the block composed of a plurality of word lines; and
- a controller configured to set a flag value based on a last coded word line storing data within the block,
- wherein the controller is further configured to set the flag value based on determining the last word line storing data within the block is greater than a word line threshold.

* * * * *